(12) United States Patent
Takayama

(10) Patent No.: US 6,193,525 B1
(45) Date of Patent: Feb. 27, 2001

(54) SOCKET FOR ELECTRICAL PARTS

(75) Inventor: Naoaki Takayama, Kawaguchi (JP)

(73) Assignee: Enplas Corporation, Saitama-ken (JP)

( * ) Notice: Under 35 U.S.C. 154(b), the term of this patent shall be extended for 0 days.

(21) Appl. No.: 09/199,770

(22) Filed: Nov. 25, 1998

(30) Foreign Application Priority Data

Nov. 28, 1997 (JP) .................................................. 9-344023

(51) Int. Cl.⁷ .............................. H01R 12/00; H05K 1/00
(52) U.S. Cl. ................................................. 439/71; 439/70
(58) Field of Search ................................. 439/71, 70, 72, 439/73, 74, 330, 331

(56) References Cited

U.S. PATENT DOCUMENTS

| | | | | |
|---|---|---|---|---|
| 5,653,597 | * | 8/1997 | Chang ....................................... | 439/49 |
| 5,733,132 | * | 3/1998 | Belopolsky et al. .................... | 439/73 |
| 5,823,794 | * | 10/1998 | Abe ......................................... | 439/73 |
| 5,829,988 | * | 11/1998 | McMillan et al. ...................... | 439/70 |

FOREIGN PATENT DOCUMENTS 06310625   11/1994  (JP) .
08045631   2/1996   (JP) .

* cited by examiner

*Primary Examiner*—Lincoln Donovan
*Assistant Examiner*—Kyung S. Lee
(74) *Attorney, Agent, or Firm*—Fish & Richardson P.C.

(57) ABSTRACT

In a socket for an electrical part, the electrical part is mounted on one surface of a socket body of the socket and a plurality of electrical conductive members are disposed to the socket body and are in contact with terminals of the electrical part mounted on the one surface so as to electrically be conducted therewith, respectively. A press member for pressing the electrical part is mounted to the socket body to be supported by a pivotally and movably support device disposed to the socket body to an open position located away from an upper side of the one surface of the socket body. The pivotally and movably support device makes the press member, which is positioned to the open position, pivot to a close position located in the upper side of the one surface thereof. The pivotally and movably support means makes the press member pivoted to the close position move on a parallel to a vertical direction toward the electrical part on the one surface of the socket body so as to press the electrical part thereto.

13 Claims, 16 Drawing Sheets

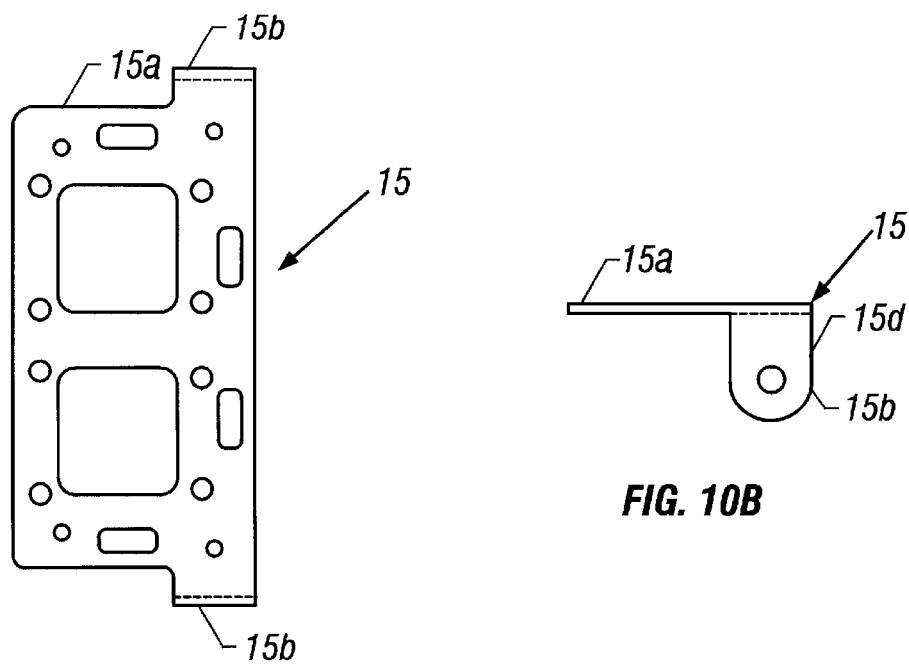
FIG. 10A
FIG. 10B
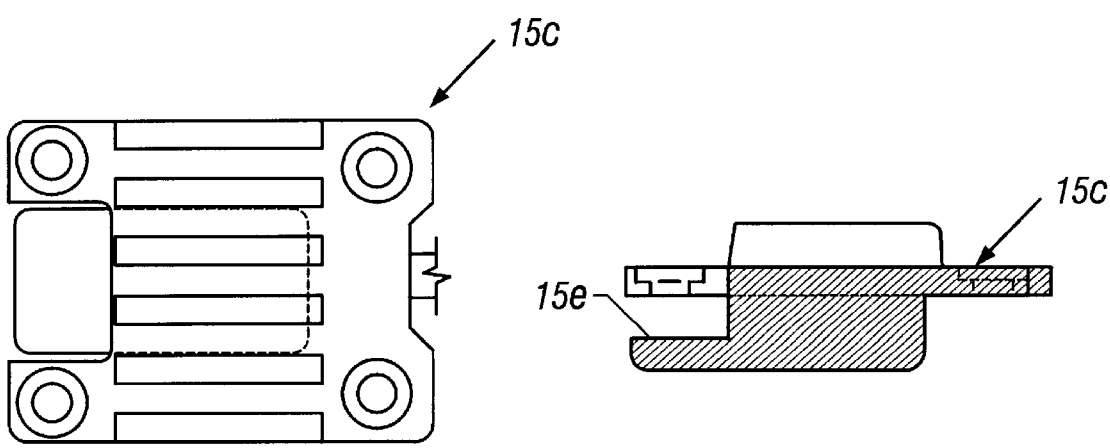
FIG. 11A
FIG. 11B

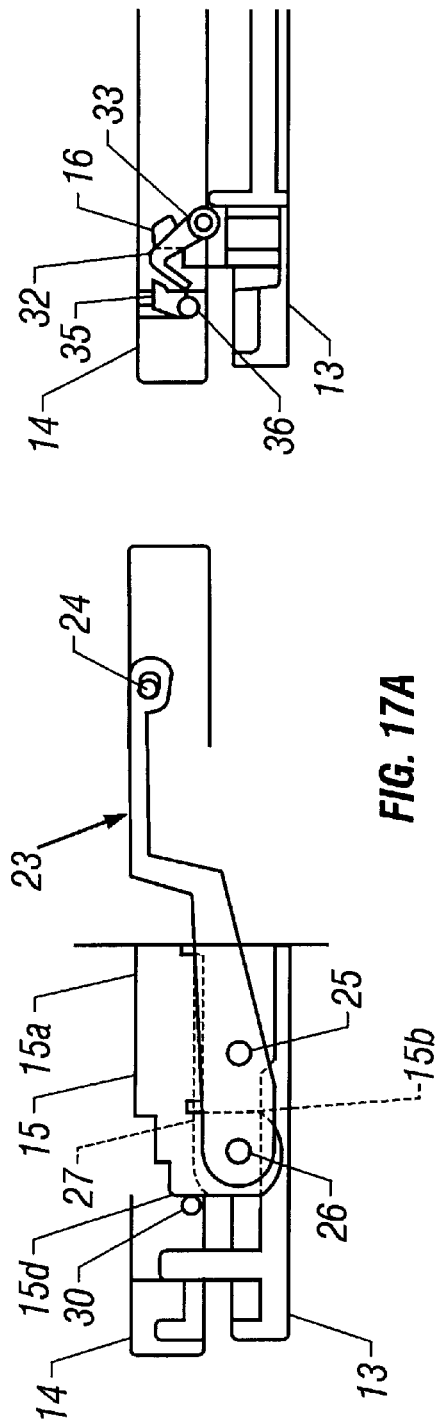
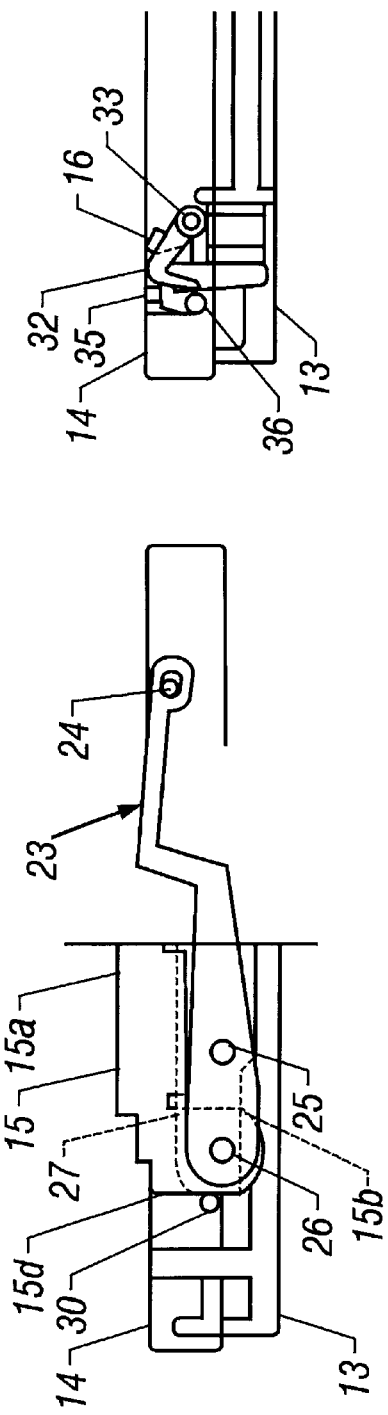
FIG. 17A
FIG. 17B

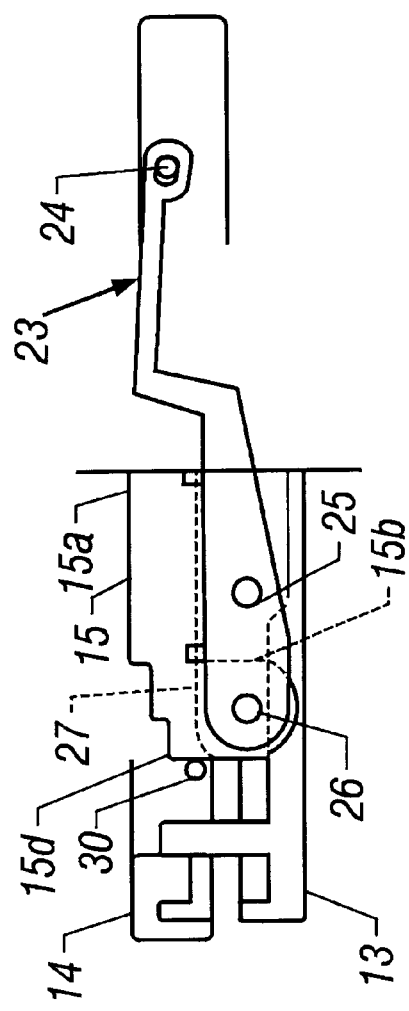
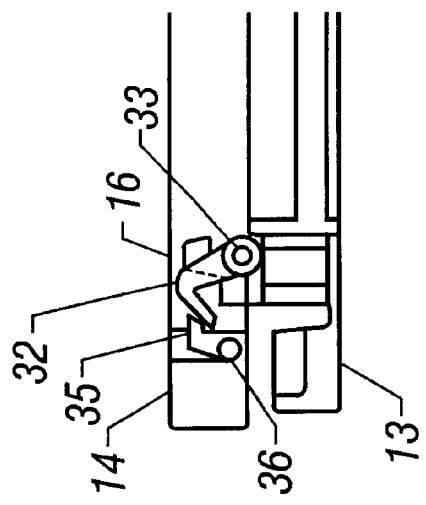
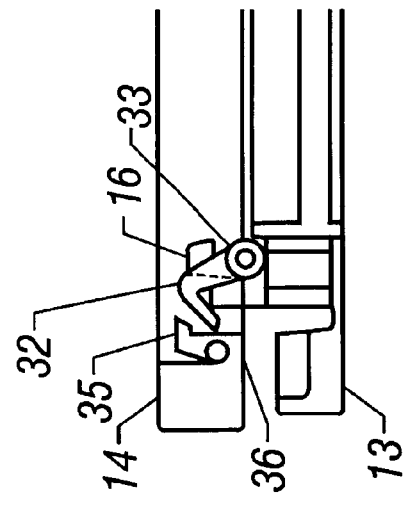
*FIG. 21A*
*FIG. 21B*

SOCKET FOR ELECTRICAL PARTS

BACKGROUND OF THE INVENTION

The present invention relates to a socket, particularly, an IC socket, for an electrical part or component, such as a semiconductor device (hereinafter, referred to as an IC (Integrated Circuit) package), which holds detachably the electrical part.

As a conventional socket for an electrical part, which is capable of holding the electrical part, in order to put an IC package as the electrical part to a performance test, such as a burn-in test or other similar tests, there is a socket adapted to hold the IC package to be tested.

The socket for the electrical part has a socket body on which the IC package is mounted and a hold cover pivotally attached to the socket body. The hole cover is adapted to pivot downward so as to hold the IC package mounted on the socket body from an upper side of the IC package. A plurality of electrodes disposed to the IC package are so pressed, by a predetermined pressure caused by the hold cover, as to be welded to electrical conductive members disposed to the socket body.

However, in the conventional socket described above, the hold cover is adapted to pivot about a pivot pin or shaft (hereinafter, referred to a pivot pin) of the socket body and is not adapted to move vertically from an upper side of the IC package to a lower side thereof so as to hold the IC package. Therefore, since, while the hold cover pivots about the pivot pin, one portion of the hold cover adjacent to the pivot pin firstly presses the IC package and, after that, another portion of the hold cover adjacent to the pivot pin presses it, it is difficult to press the IC package simultaneously by the one and another positions thereof.

As a result, the portion of the IC package adjacent to the pivot pin of the socket body, which is firstly pressed by the hold cover, is subjected to a large pressure thereby deforming the electrodes disposed to the firstly pressed portion of the IC package and deforming the IC package itself, and therefore, there is a possibility that an IC chip included in the IC package is damaged.

Especially, in the socket for holding a large-sized IC package or a semiconductor device having a printed circuit board or a printed board (hereinafter, referred to printed circuit board) on which a plurality of IC chips are mounted and operative to one package, the above inconveniences of deforming the electrodes of the IC package and the IC package itself are remarkably exposed.

SUMMARY OF THE INVENTION

The present invention is directed to overcome the foregoing problems. Accordingly, it is an object of the present invention to provided a socket for an electrical part, which is capable of pressing, in a balanced state, the electrical part, such as an IC package, so as to prevent electrodes of the IC package and the IC package itself from being damaged.

Another object of the present invention is to provide a socket for an electrical part, which can reduce a space which allows the member to pivot upward so as not to need to take up much space from an upper side of the socket.

These and other objects can be achieved according to the present invention by providing a socket for an electrical part comprising:

a socket body having one surface on which the electrical part having a terminal is mounted;

an electrical conductive member disposed to the socket body and adapted to contact the terminal of the electrical part so as to establish an electrical connection between the socket body and the terminal;

a press member mounted to the socket body and adapted to press the electrical part; and support means disposed to the socket body and adapted to support the press member to an open position located away from an upper side of the one surface of the socket body for pivoting the press member positioned to the open position to a close position located in the upper side of the one surface thereof and for moving the press member pivoted to the close position toward the electrical part on the one surface of the socket body so as to press the electrical part thereto.

In a preferred embodiment, the press member pivoted to the close position is arranged in parallel to the one surface of the socket body so as to move by the support means in parallel to a vertical direction orthogonal to the one surface of the socket body. The support means comprises an upper operation member disposed to the socket body so as to be movable along the vertical direction and a support device operatively joined to the upper operation member and the press member and adapted to operate together with the movement of the upper operation member, and when the upper operation member moves downward along the vertical direction, the support device operates according to the movement of the upper operation member so that the press member positioned to the close position moves upward along the vertical direction while pivoting to the open position, and when the upper operation member moves upward along the vertical direction, the support device operates according to the movement of the upper operation member so that the press member pivots from the open position to the close position and moves downward in parallel to the vertical direction, whereby the press member presses the electrical part mounted on the one surface of the socket body. The electrical part has one surface mounted on the one surface of the socket body and other surface facing the press member located to the close position and the press member presses the other surface of the electrical part.

The press member comprises a pair of press members having a structure capable of being opened and closed like biparting doors. The support means includes an elastic member adapted to urge the upper operation member with a predetermined urging force upward along the vertical direction, while each of the press members is arranged to each side portion of the socket body corresponding to the open position, the upper operation member being biased to a predetermined position against the urging force, and when the upper operation member moves upward along the vertical direction by the urging force from the predetermined position, each of the press members pivots from each side of the socket body toward the close position.

When the press member is located to the close position, the press member has a flat plate portion opposite to the one surface of the socket body and substantially parallel to the one surface thereof, and the electrical part is pressed in a balanced state by the flat plate portion of the press member. The press member is located to the open position, and the flat portion of the press member is arranged substantially along the vertical direction in which the flat portion of the press member allows the electrical part mounted on the one surface to be removed therefrom.

The support device has a support member disposed to the socket body to be movable along the vertical direction, the press member being mounted pivotally on the support member and link means joining the support member with the upper operation member and pivotally mounted on the socket body, wherein, when the upper operation member moves downward along the vertical direction, the support member moves upward therealong with a pivotal operation of the link means together with the press member and pivots from the close position to the open position, and when the upper operation member moves upward along the vertical direction, the press member pivots from the open position to the close position and moves downward along the vertical direction with a pivotal operation of the link means.

The link means has two pairs of link members each of which has one end portion, another end portion, a middle portion, a pin hole formed through the middle portion, a support pin attached to the socket body and inserted in the pin hole for pivotally supporting the link member about the support pin, a first long hole formed through the one end portion, a first pin attached to the upper operation member and fitted idly in the first long hole, a second long hole formed through the another end portion and a second pin provided to the support member and fitted idly in the second long hole, said support member has a third long hole having a predetermined width a longitudinal direction of which is arranged along the vertical direction, the support pin penetrating the third long hole of the support member and the predetermined width of the third long hole permitting the support member to be slidable along the vertical direction with respect to the support pin, and wherein, when the upper operation member moves downward along the vertical direction, the each of the link members pivots about the support pin so that the other end portion of each of the link members is displaced upward along the vertical direction, whereby the support member and the press member joined together by the second pin make a parallel displacement along the vertical direction toward the mounted surface of the socket body, while the support member is prevented from moving along the horizontal direction by the support pin.

The support means has latch means attached to the support member for fixedly latching the press member to the support member, the latched press member being located to the close position. The support means has means operatively joined to the latch means and the upper operation member for releasing the press member from the latched state to the support member according to the downward movement of the upper operation member and for returning the press member to the latched state according to the upward movement of the upper operation member.

The press member is provided with a heat sink for radiating heat caused from the electrical part.

According to the structures and characters of the present invention described above, it is possible to move the press member downward in parallel to the vertical direction while the press member is arranged along substantially the horizontal direction, thereby pressing surely, in a balanced state, an upper surface of the electrical plate facing the press member.

Moreover, since the press member comprises a pair of press members having the structure capable of being opened and closed like the biparting doors, as compared with the using of a single press member, it is possible to reduce a space which allows the pair of press members to pivot upward, thereby requiring no much space from the upper side of the electrical member.

Furthermore, because the support member provided with the press member along the vertical direction according to the vertical movement of the upper operation member and the press member moves along the vertical direction with being arranged along the horizontal direction, the effects described above is gained by a comparatively simple structure.

While, in this aspect of the present invention, the press member is arranged along the horizontal direction, the press member is fixedly latched by the latch means attached to the support member, so that, even if the electrical part has a large size, one end portion of the press member does not float, making it possible to surely press in a balanced state the whole of the upper surface of the electrical part.

Still furthermore, since heat caused from the electrical part is radiated by the heat sink provided to the press member, it is possible to improve radiation efficiency of the electrical part.

Still furthermore, in this aspect of the present invention, since the latched state of the press member by the latch means is released by the release and return means according to only the downward movement of the upper operation member and the released state of the press member is returned by the release and return means to the latched state of the press member according to only the upward movement of the upper operation member, it is possible to surely press in a balanced state the electrical part by the press member and to surely release the press member from the latched state.

BRIEF DESCRIPTION OF THE DRAWINGS

Other objects and aspects of the present invention will be made further clear from the following description of an embodiment with reference to the accompanying drawings in which:

FIG. 10A is a plan view showing the press member of the IC socket according to the embodiment, and FIG. 10B is a front view showing the press member according to the embodiment;

FIG. 11A is a front view showing a heat sink of the IC socket according to the embodiment, and FIG. 11B is a cross sectional view showing the heat sink according to the embodiment;

FIGS. 17A and 17B are views for explaining a motion of an upper operation member of the IC socket when the upper operation member is operated according to the embodiment;

FIGS. 21A and 21B are views for explaining a motion of the upper operation member of the IC socket when the upper operation member is operated according to the embodiment;

DESCRIPTION OF THE PREFERRED EMBODIMENT

Figure 1:
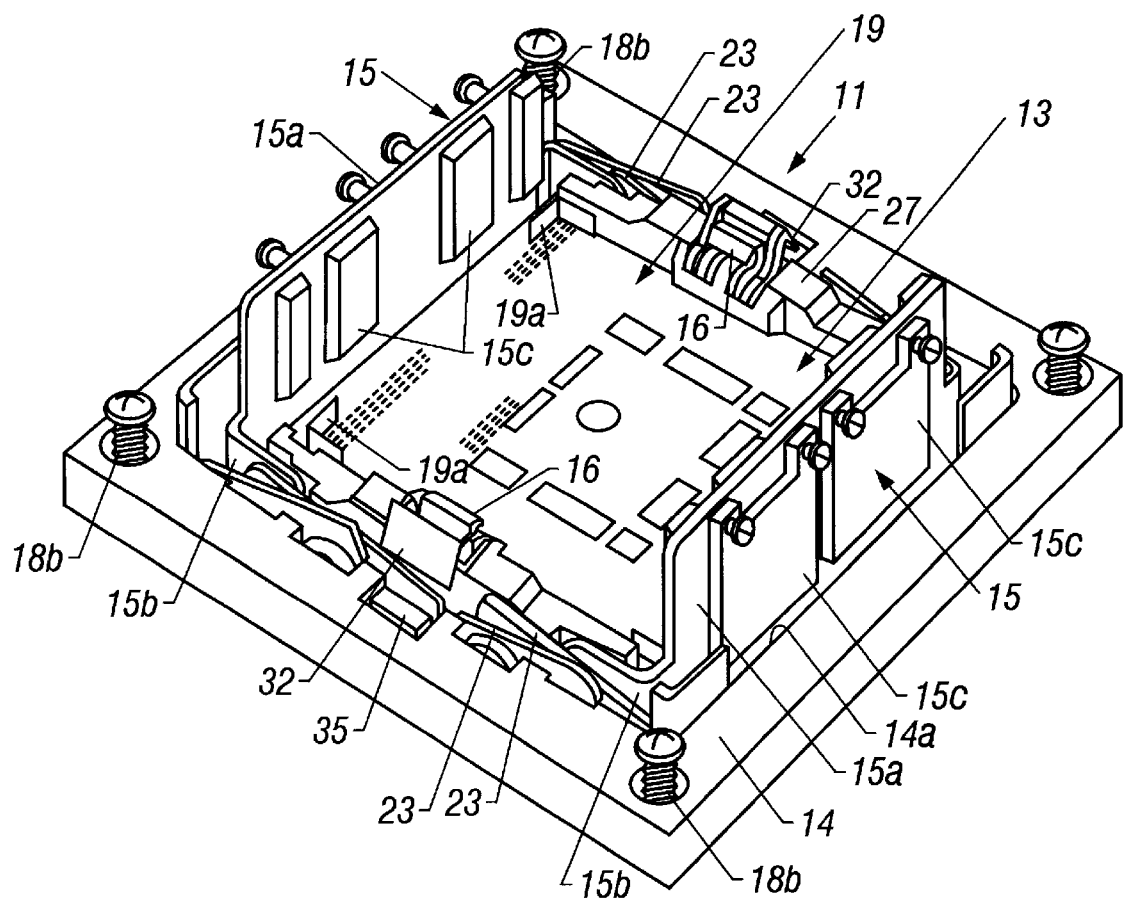
FIG. 1 is a perspective view showing an IC socket in a state of a pair of press members being opened, according to an embodiment of the invention.

One preferred embodiment of the present invention will be described hereinafter with reference to the accompanying drawings.

FIG. 1 to FIG. 22B show the embodiment of the present invention.

Referring first to a construction of the embodiment, reference numeral 11 represents an IC socket as a socket for an electrical part. For putting an IC package as the electrical part to a performance test, the IC socket 11 is operative to electrically connect terminals 12b of the IC package 12 to a printed circuit board (not shown) of a tester.

Figure 22A:
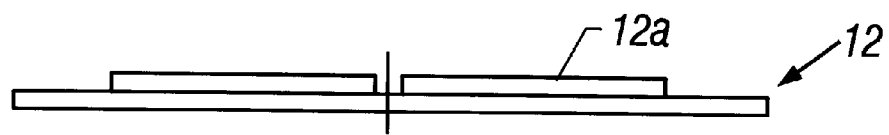
FIG. 22A is a front view showing an IC package according to the embodiment.
Figure 22B:
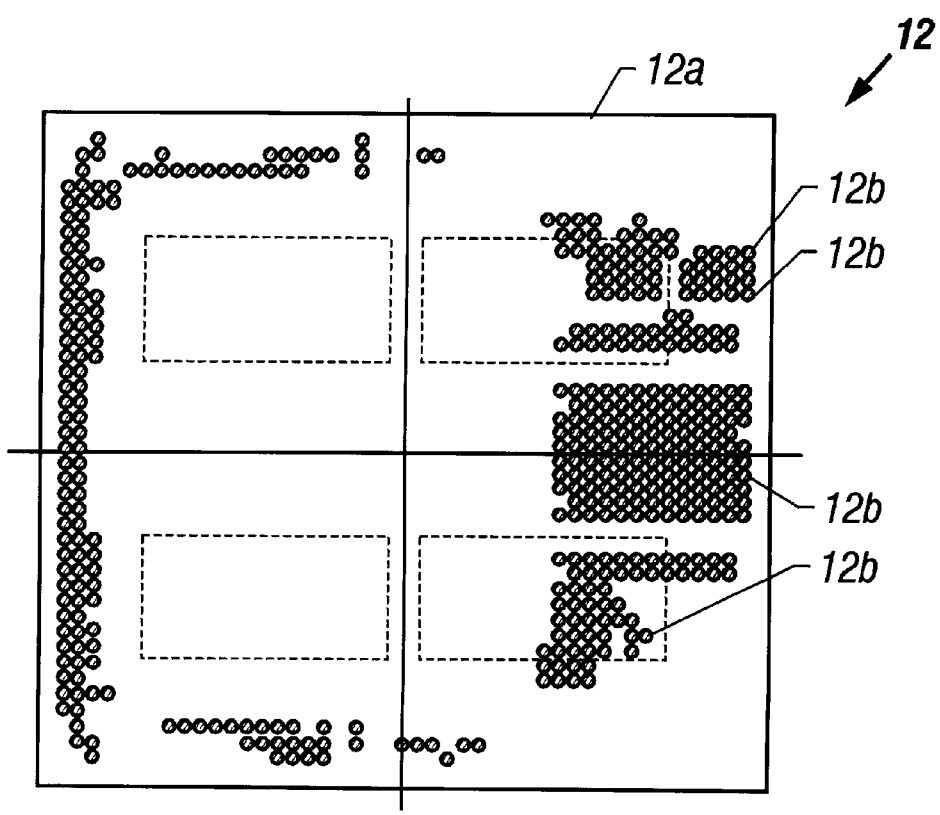
FIG. 22B is a bottom view of the IC package of FIG. 22A.

This IC package 12, as shown in FIG. 22A and FIG. 22B, is provided with a package body 12a having a square shape, on which a plurality of IC are mounted. The square-shaped package body 12a has four sides, each of which is substantially 5 cm so that the package body has a comparatively big size. A plurality of terminals 12b are disposed to a bottom surface of the package body 12a.

Figure 3:
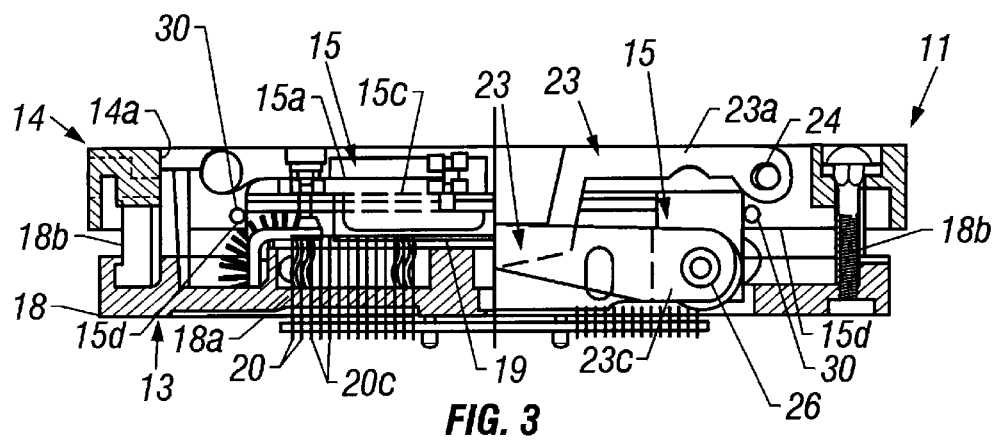
FIG. 3 is a front view, partly in cross section, showing the IC socket according to the embodiment.

The IC socket 11, as shown in FIG. 3 and other drawings, has a socket body 13 to be fitted to the printed circuit board and the IC package 12 is mounted on a mounted surface of the socket body 13. An upper operation member 14 is disposed to the socket body 13 so that the upper operation member 14 is capable of moving vertically.

The IC socket 11 also has a pair of press members 15 for holding the IC package 12 mechanically joined to the upper opening member 14. The pair of press members 15 has a structure to be capable of being opened and closed (open-close structure herein later) like biparting doors, that is, double hinged doors.

Namely, while the press members 15 are closed, the press members 15 are arranged side by side above the socket body 13 and, when the upper operation member 14 moves upward or downward, i.e., in this embodiment, downward, the downward movement of the upper operation member 14 enables the press members 15 to be opened from the above portion of the socket body 13 toward both first and second side portions of the socket body 13 facing with each other. While the press members 15 are opened, the press members 15 are arranged to both first and second side portions of the socket body 13 and, when the upper operation member 14 moves upward, the upward movement of the upper operation member 14 enables the press members 15 to be closed from the both first and second side portions of the socket body 13 toward the above portion of the socket body 13.

While the pair of press members 15 are closed, the pair of press members 15 is secured to the socket body 13 by latch members 16, in this embodiment, two latch members 16, as latch means.

To explain the IC socket 11 concretely, the socket body 13 has a base member 18 having a plurality of through holes 18a and a floating plate 19 having one surface for mounting the IC package 12 and other surface facing each other. The other surface of the floating plate 19 is mounted on a substantially center portion of the base member 18. A plurality of contact pins 20 are disposed between the floating plate 19 and the base member 18 so that each of the contact pins 20 is arranged along a vertical direction orthogonal to the one surface of the floating plate 19.

Incidentally, in this specification, as described above, "vertical direction" is employed to mean "a direction orthogonal to the one surface of the floating plate 19 for mounting the IC package" and therefore, "an upper direction, an upward direction and other similar descriptions" are employed to mean "a direction along the vertical direction away from the one surface of the floating plate 19". Similarly, "a lower direction, a downward direction and other similar descriptions" are employed to mean "a direction along the vertical direction close to the one surface of the floating plate 19".

Figure 5:
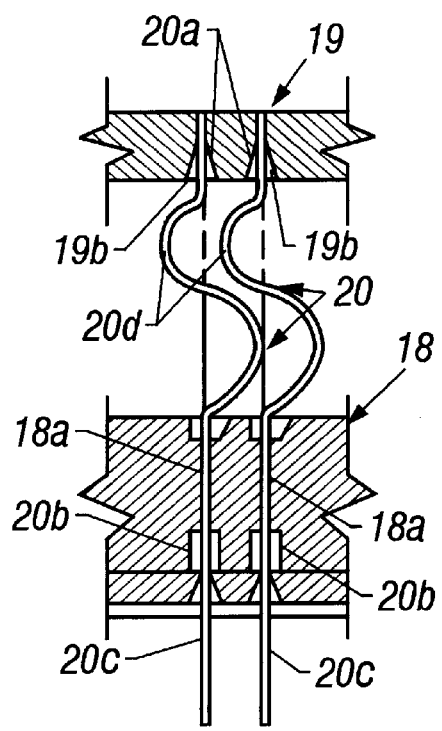
FIG. 5 is a cross sectional view showing a state of contact pins according to the embodiment.

The floating plate 19 has a substantially square shape and four corners to which guide portions 19a are attached so that the four corners project upward, respectively. The floating plate 19 also has a plurality of penetration holes 19b formed therethrough, in which the contact pins 20 are inserted, respectively. Each of the contact pins 20, as shown in FIG. 5, has an upper end portion 20a inserted into the corresponding penetration hole 19b and a lower portion 20b including a lead portion 20c inserted through the corresponding through hole 18a so that the lead portion 20c projects downward.

Each of the contact pins 20 also has a middle portion 20d joining the upper end portion 20a and the lower end portion 20b and adapted to be elastically deformed. Each of the contact pins 20 is made of a material having an excellent conductivity and the lead portion 20c of each of the contact pins 20 is electrically connected to the printed circuit board. The upper end portion 20a of each of the contact pins 20 is in contact with the corresponding terminal 12b of the IC package 12.

Figure 2:
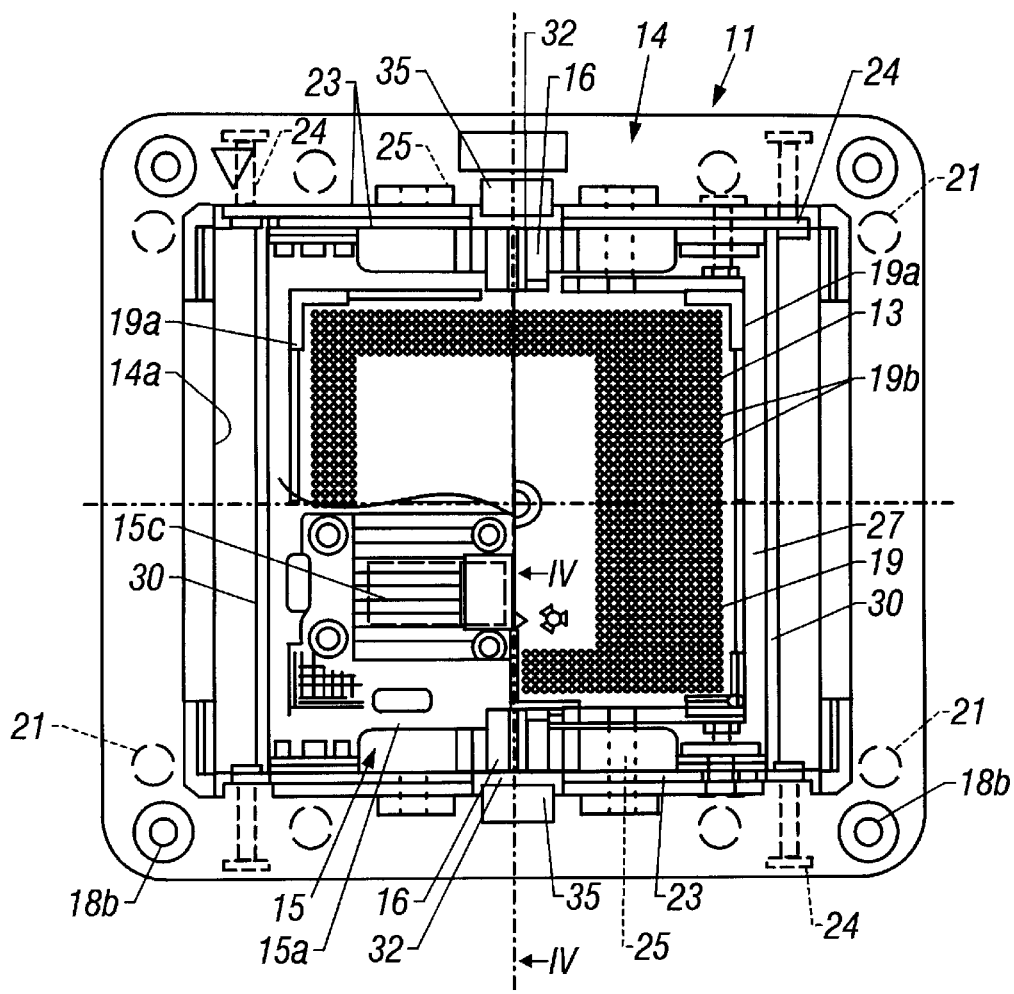
FIG. 2 is a plan viewr partly in cross section, showing the IC socket according to the embodiment.
Figure 6:
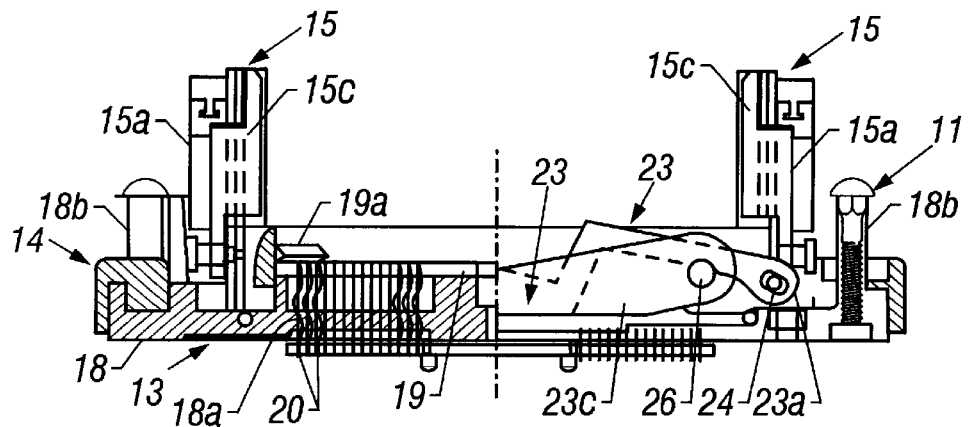
FIG. 6 is a front view corresponding to FIG. 3 showing the IC socket in a state of the pair of press members being opened, according to the embodiment.
Figure 7A:
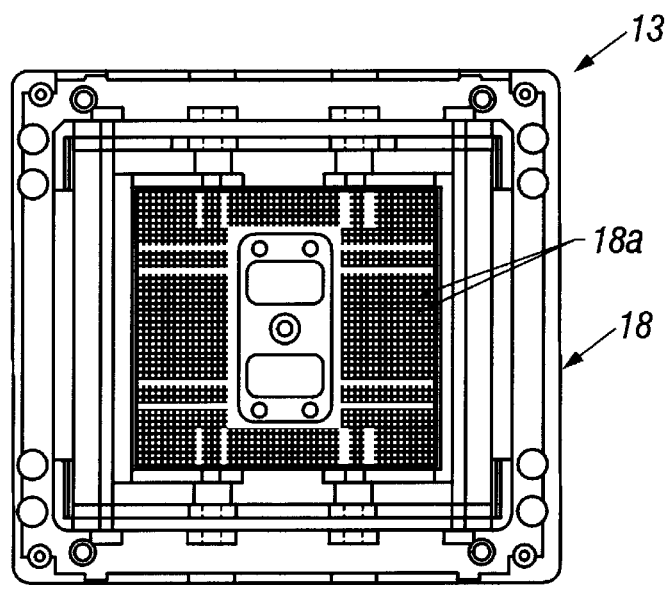
FIG. 7A is a plan view showing a socket body of the IC socket according to the embodiment and FIG. 7B is a front view, in half cross section, showing the socket body of the IC socket according to the embodiment.
Figure 7B:
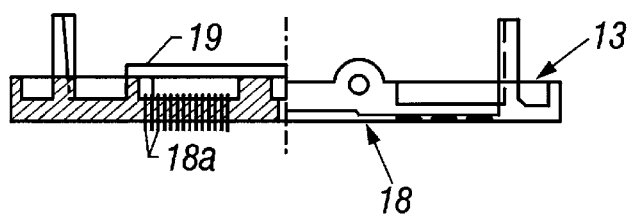
Figure 8:
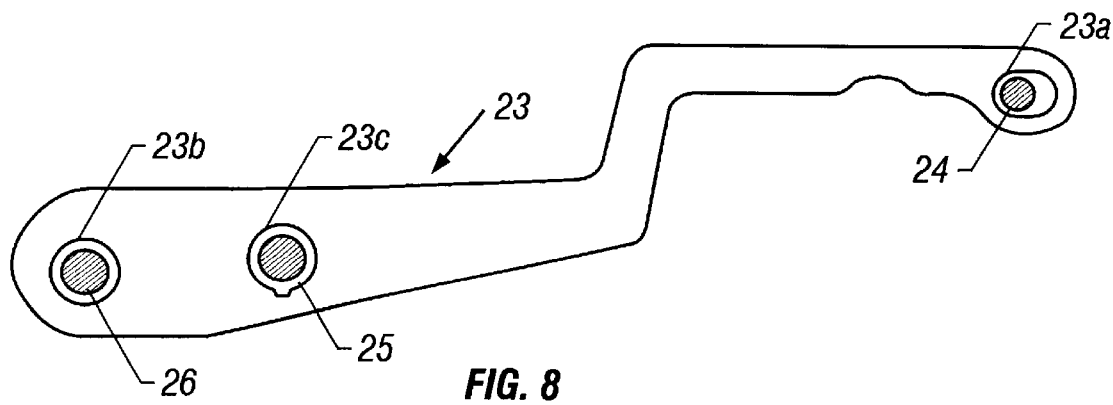
FIG. 8 is a front view showing a link member according to the embodiment.

The upper operation member 14 has a substantially square shape and, as shown in FIGS. 1 and 2, is formed with an opening 14a having a predetermined area which allows the IC package 12 to be inserted therein. The IC package 12 is adapted to be inserted through the opening 14a so as to be mounted on the one surface of the floating plate 19 of the socket body 13. The upper operation member 14, as shown in FIGS. 2 and 6, is arranged so that the upper operation member 14 is capable of moving vertically with being guided by guide posts 18b disposed to the base member 18 of the socket body 13. The upper operation member 14 is adapted to be urged upward by a n elastic member such as a spring 21 shown in FIG. 2.

Moreover, among the upper operation member 14, the socket body 13 and a support member 27 described hereinafter, as shown in FIG. 1, FIG. 2, FIG. 3, FIG. 8, FIG. 15, FIG. 16 and so on, two pairs of link members 23 are disposed, in which the number of the link members 23 is four in total.

The link members 23 have substantially the same structure, respectively, and therefore, the structure of one of the link members 23 will be explained hereunder.

The link member 23 has a middle portion through which a pivot hole or pin hole (hereinafter, referred to pin hole) 23c is formed and a support pivot or support pin (hereinafter, referred to support pin) 25 inserted therein. The support pin 25 is attached to the socket body 13 for pivotally supporting the link member 23 so that the link member 23 is pivotally mounted on the socket body 13. The link member 23 is provided at its one end portion with a long hole 23a formed therethrough, in which a first pin 24 provided to the upper operation member 14 is idly fitted so as to be joined thereto. The link member 23 is also provided at its other end portion with a long hole 23b formed therethrough, in which a second pin 26 provided to the support member 27 is idly fitted so as to be joined thereto. Then, the support pin 25 penetrates a long hole 27a of the support member 27. The long hole 27a is formed through the support member 27 so that a longitudinal direction of the long hole 27a is arranged along the vertical direction. The long hole 27a has a predetermined width which permits the support member 27 to be slidable vertically with respect to the support pin 25.

Figure 9A:
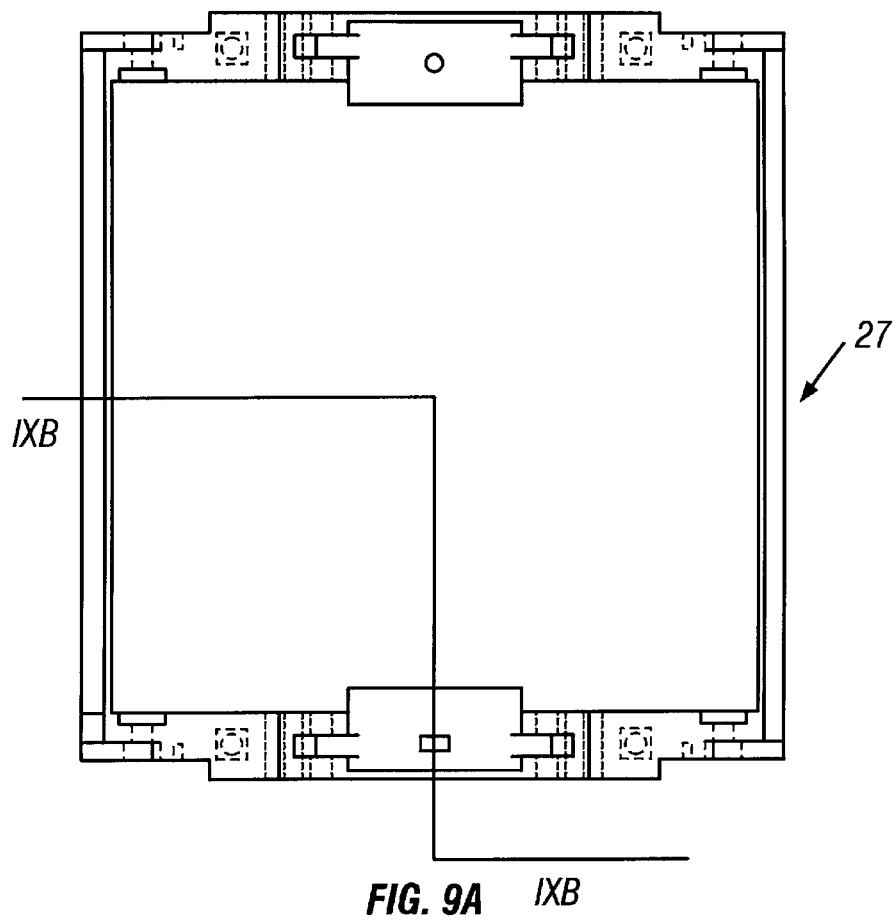
FIG. 9A is a plan view showing a support member of the IC socket according to the embodiment and FIG. 9B is a cross sectional view taken along the line IXB—IXB of FIG. 9A.
Figure 9B:
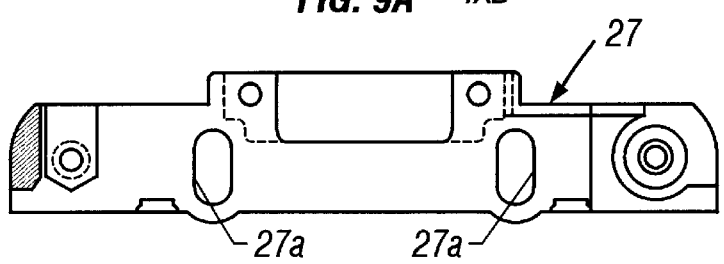

The support member 27, as shown in FIG. 9 and so on, has a substantially square shape and is disposed around the floating plate 19 so as to move vertically. The support member 27 is adapted to move upward through the link members 23 by moving the upper operation member 14 downward.

In the support member 27, the pair of press members 15 is arranged so that the pair of press members 15 has the open-close structure like the biparting doors.

Each of the press members 15 has substantially the same structure, and therefore, the structure of one of the press members 15 is explained hereunder.

Figure 15:
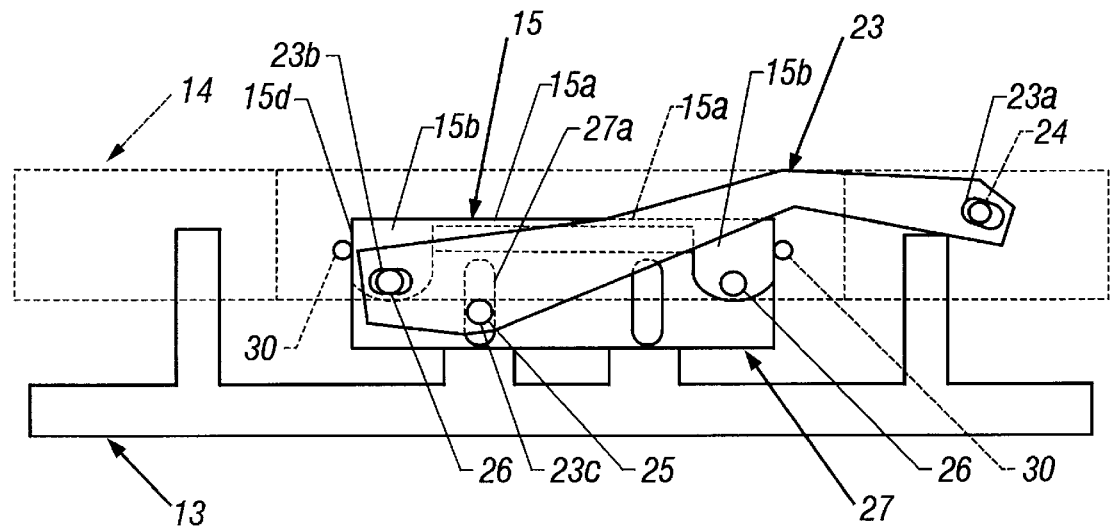
FIG. 15 is a view for explanation schematically showing the IC socket in a state of the press member being closed, according to the embodiment.
Figure 16:
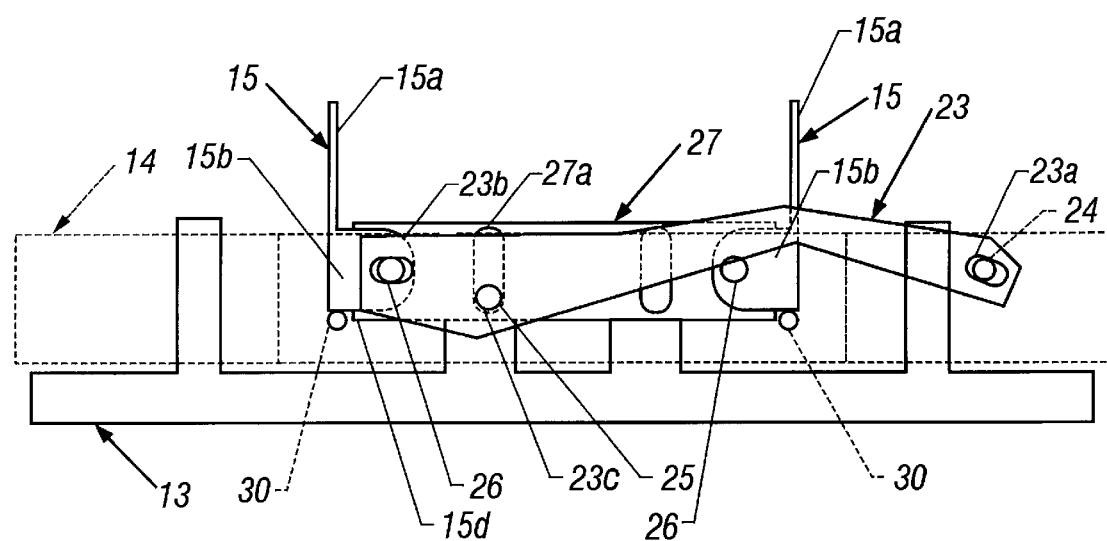
FIG. 16 is a view for explanation schematically showing the IC socket in a state of the press member being opened, according to the embodiment.

That is, the press member 15, as shown in FIG. 1, is provided with a flat plate portion 15a having a flat lower surface for pressing an upper s surface of the IC package 12 and a pair of base end portions 15b, while the press member 15 is arranged along a horizontal direction orthogonal to the vertical direction shown in FIG. 15, projecting downward from both sides of one end portion of the flat plate 15a. The pair of base end portions 15b, as shown in FIGS. 15 and 16, is pivotally supported to the second pin 26 of the support member 27 and is adapted to be biased toward an opening direction of the press member 15 by a first spring (not shown).

The press member 15, as shown in FIGS. 11A and 11B, also has heat sinks 15c for radiating heat caused from the IC package 12, each of which is formed with a support groove 15e and adapted to receive the flat plate portion 15a so that the heat sinks 15c are attached to the flat plate portion 15a while the flat plate portion 15a is fit in the support grooves 15e of the heat sinks 15c. Each of the heat sinks 15c is made through an aluminium die-cast and has a high thermal conductivity. While the press member 15 is closed, as shown in FIG. 3, the flat plate portion 15a and the heat sinks 15c of the press member 15 are arranged substantially along the horizontal direction parallel to the one surface of the floating plate 19 on which the IC package 12 is mounted and a lower surface of the flat plate portion 15a is opposite to the one surface of the floating plate 19.

While the press member 15 is opened, as shown in FIG. 6, the flat plate portion 15a and the heat sinks 15c of the press member 15 are arranged substantially along the vertical direction. The vertical arrangement of the flat plate portion 15a and the heat sinks 15c of the press member 15 allow the IC package 12 mounted on the floating plate 19 to be removed therefrom.

The press member 15 is opened and closed with an aid of an actuation pin 30. That is, while the press member 15 is closed and the upper operation member 14 has been reached to a highest position (an upper limit position), as shown in FIG. 15, the actuation pin 30 is provided for the upper operation member 14 so as to be fittedly in contact with an upper end portion of a slide side portion 15d of the press member 15 so that the flat plate portion 15a of the press member 15 is held along the horizontal direction above the socket body 13.

On the other hand, as the upper operation member 14 starts to move downward, the actuation pin 30 moves downward along the slide side portion 15d while being in contact therewith, so that the press member 15 is opened by an urging force of the first spring, as shown in FIG. 16.

In a state that each of the press members 15 is closed, each end portion of each flat plate portion 15a of each press member 15 facing with each other is so latched as to be supported by the latch members 16.

That is, when the press members 15 are closed, the respective one end portions of the press members 15 adjacently arranged side by side are fixedly latched by the two latch members 16, one of which is disposed to a middle portion of a third side portion of the socket body 13 and other thereof is disposed to a middle portion of a fourth side portion thereof, wherein the two latch members face with each other. Each of the latch members 16 is adapted to support a latch arm member 32.

The latch members supporting the latch arm member 32 have substantially the same structure, respectively, and therefore, the structure of one of the latch members 16 supporting the latch arm member 32 will be explained hereunder.

That is, the latch member 16 and the latch arm member 32 supported thereto are pivotally attached by a first pin member 33 to the support member 27. The latch member 16 and the latch arm member 32 are adapted to be urged by a second spring (not shown) toward a latch direction corresponding to a clockwise direction in FIG. 4 or FIG. 17, for example. While the latch member 16 stands vertically, that is, the latch member 16 is arranged vertically and one end portion 16u of the latch member 16 is directed to the upper portion, the latch member 16 is secured by a stopper (not shown).

Figure 4:
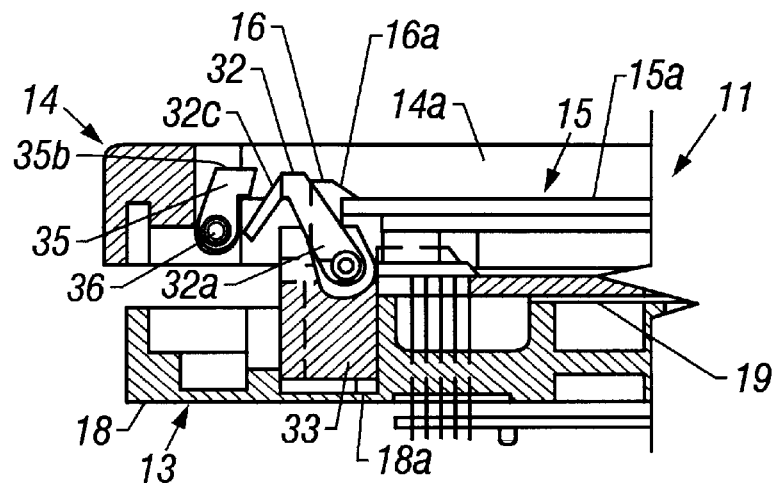
FIG. 4 is a cross sectional view taken along the line IV—IV of FIG. 2.
Figure 12A:
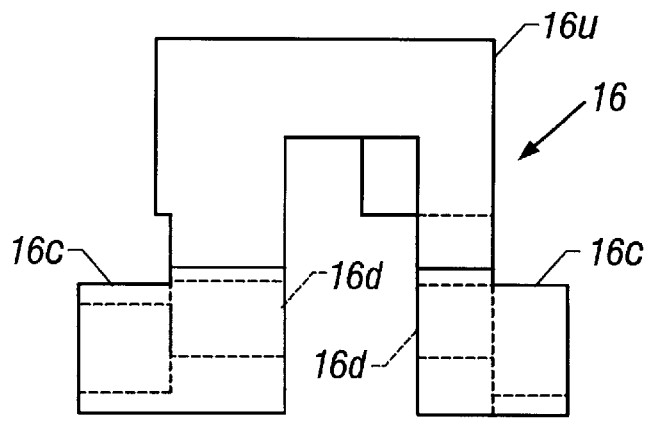
FIG. 12A is a front view showing a latch member of the IC socket according to the embodiment.
Figure 12B:
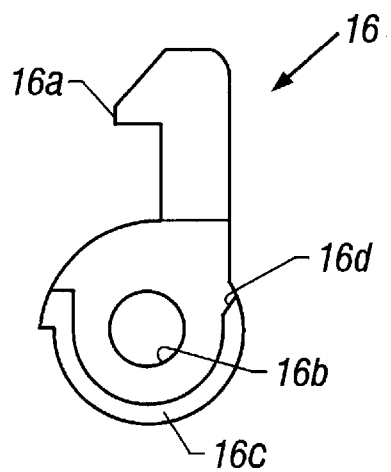
FIG. 12B is a left side view of the latch member of FIG. 12A.
Figure 12C:
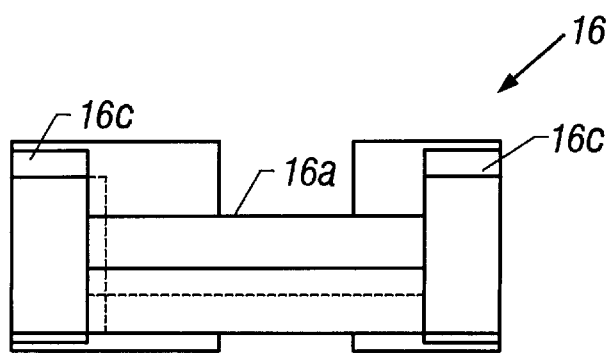
FIG. 12C is a plan view of the latch member of FIG. 12A.

The latch member 16 which stands vertically, as shown in FIGS. 12A, 12B and 12C, is provided at its upper end portion corresponding to the one end portion 16u with a hook portion 16a having a substantially hook shape. The hook portion 16a is adapted to be engaged with an upper surface portion of the one end portion of the flat plate portion 15a of the press member 15, as shown in FIG. 4. The latch member 16 is provided at its lower portion with a pivot hole 16b and, around the pivot hole 16b, an engaging portion 16c having a substantially semi-circular cylindrical shape is formed so as to be engaged with the latch arm member 32.

Figure 13A:
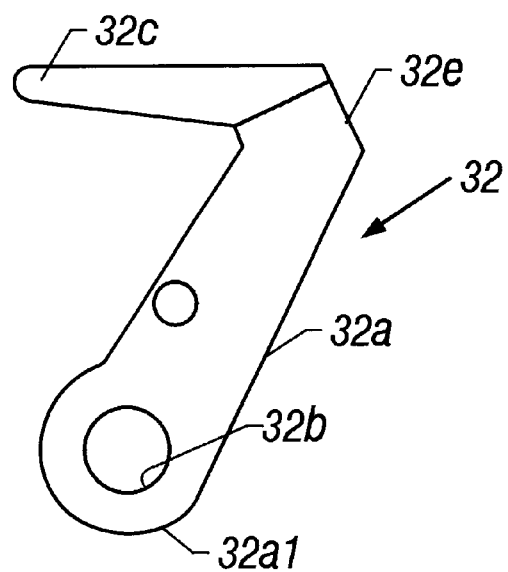
FIG. 13A is a front view showing a latch arm member of the IC socket according to the embodiment.
Figure 13B:
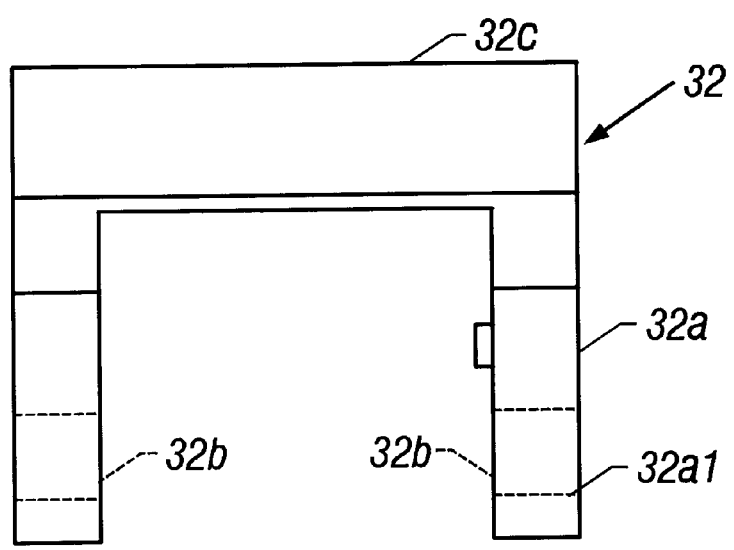
FIG. 13B is one side (right side) view of the latch arm member of FIG. 13A.
Figure 14A:
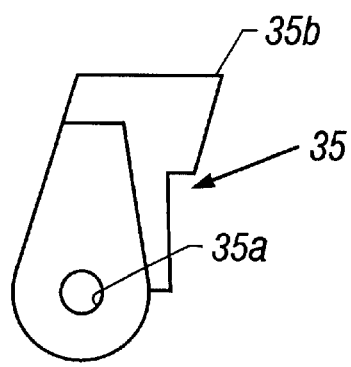
FIG. 14A is one side (left side) view of a release member of the IC socket of FIG. 14B according to the embodiment.
Figure 14B:
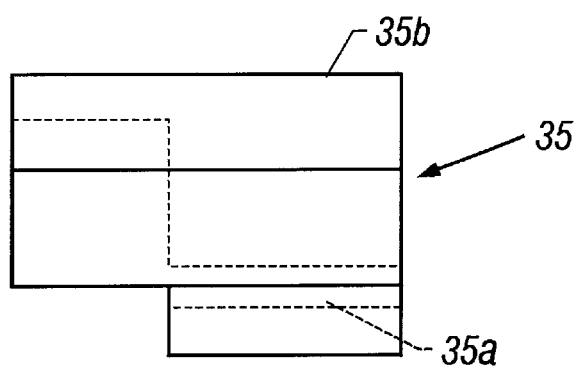
FIG. 14B is a front view showing the release member according to the embodiment.
Figure 14C:
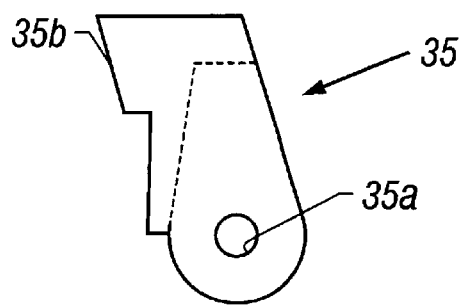
FIG. 14C is other side (right side) view of the release member of FIG. 14B.

In addition, the latch arm member 32, as shown in FIGS. 13A and 13B, has a substantially U-shape and a pair of leg portions 32a. A pin hole 32b in which the first pin member 33 is able to be inserted is formed to each of one end portions of 32a1 of the leg portions 32a. The pair of leg portions 32a is adapted to be engaged with the engaging portion 16c of the latch member 16. In the latch arm member 32, a bent portion 32c having a substantially circular-arc shape is formed to a joining portion 32e joining the leg portions 32a so that the bent portion 32c, while the latch arm member 32 stands vertically and the joining portion 32e of the latch arm member 32 is subjected to the upper direction, extends obliquely downward from the joining portion 32e of the latch arm member 32.

A relationship between the latch arm member 32 and the latch member 16 will be described hereunder. That is, the lower end portion having substantially the circular-arc shape of the leg portion 32a of the latch arm member 32 is so accommodated in the engaging portion 16c having substantially the semi-circular cylindrical shape as to be engaged therewith and the first pin member 33 is inserted in the pin hole 32b of the latch arm member 32 and the pin hole 16b of the latch member 16 so that the latch member 16 and the latch arm member 32 are pivotally engaged with each other. At that time, the leg portion 32a of the latch arm member 32 is urged by the second spring so as to approach toward an end portion 16d of the engage portion 16a of the latch member 16.

When the latch arm member 32 pivots counterclockwise about the first pin member in FIG. 4, the leg portion 32a of the latch arm member 32 is in contact with the end portion 16d of the latch member 16 so that the latch arm member 32 and the latch member 16 pivot together about the first pin member 33.

Figure 20A:
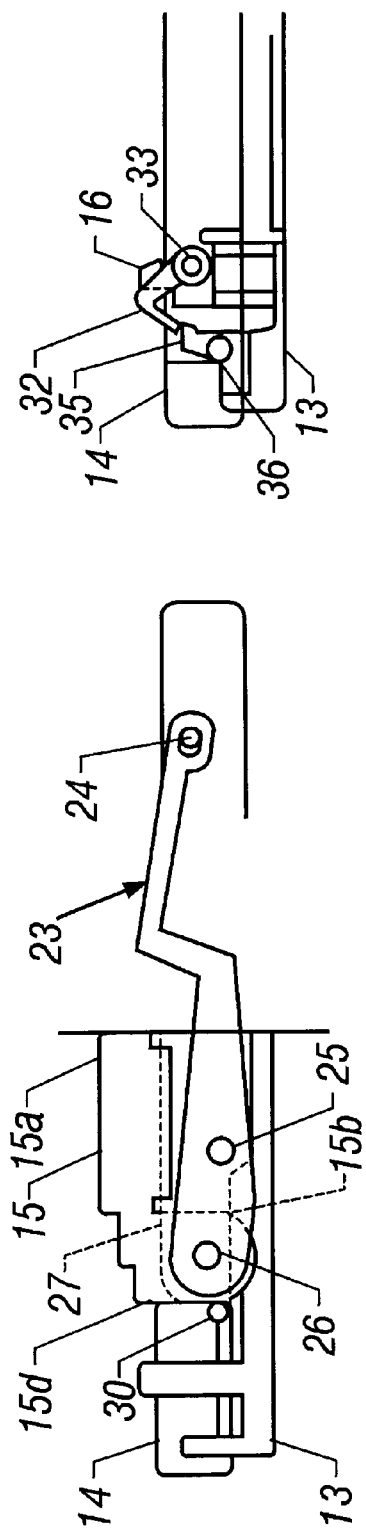
FIGS. 20A and 20B are views for explaining a motion of the upper operation member of the IC socket when the upper operation member is operated according to the embodiment.
Figure 20B:
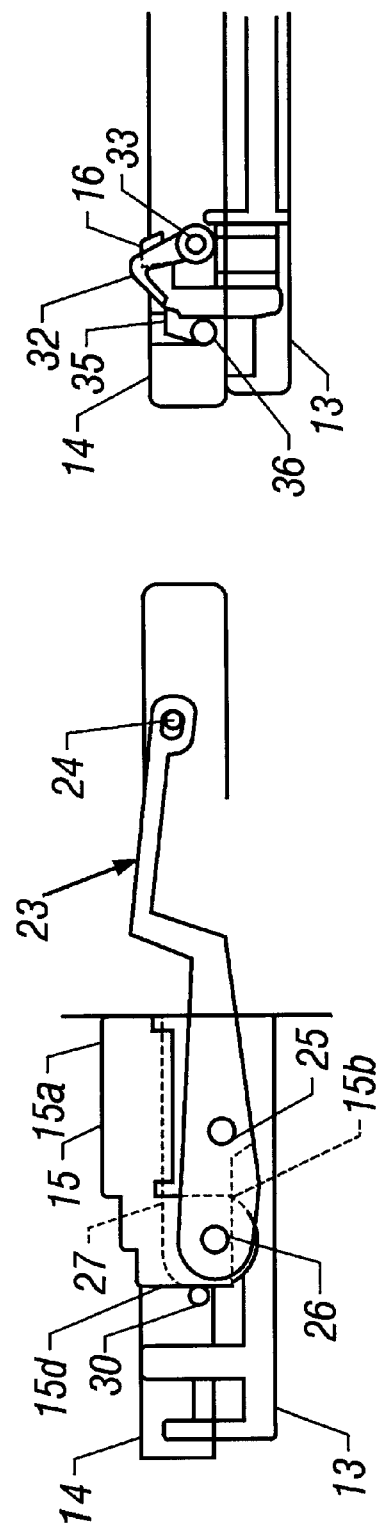

On the other hand, while the latch member 16 is arranged vertically, when the latch arm member 32 pivots about the first pin member 33 clockwise in FIG. 20, the latch member 16 does not pivot by the latch structure with respect to the flat plate portion 15a of the press member 15 so as to keep standing vertically.

Furthermore, a release member 35 for releasing the latch state of the press member 15 is provided for the upper operation member 14. The release member 35, while being arranged vertically as shown in FIGS. 4, 14A, 14B, and 14C, is provided at its lower portion with a pin hole 35a in which a second pin member 36 is inserted and at its upper portion with a press portion 35b for pressing the bent portion 32c of the latch arm member 32.

As the release member 35 has the structure mentioned above, the release member 35 is disposed to be pivotal by the second pin member 36 to the upper operation member 14 and is urged toward a direction corresponding to the clockwise direction in FIGS. 4 and 17 by a third spring (not shown). In addition, while the release member 35 is arranged vertically, the release member 35 is secured by a stopper (not shown).

When the upper operation member 14 moves downward, by the press portion 35b of the release member 35, the bent portion 32c of the latch arm member 32 is pressed downward so that the latch arm member 32 and the latch member 16 pivot together counter-clockwise, whereby the press member 15 is released from the latched state in which the press member 15 is engaged with and latched to the support member 27.

Next, a method of using the IC socket having the structure mentioned above is explained mainly with reference to FIG. 15 to FIG. 21. Incidentally, in order to aid an understanding of an operation of the IC socket in these figures, only one of the one pair of link members 23 is shown in these figures. In addition, the press members 15 have substantially same moving operation, and therefore, the moving operation of only one of the press members 15 is explained.

At first, the lead portions 20c of the contact pins 20 are previously inserted into corresponding through holes of the printed circuit board (not shown) so as to be soldered thereto, so that at least one of the IC sockets 11 is mounted on the printed circuit board.

Next, the IC package 12 is set on the IC socket 11 in a manner described hereunder so as to establish an electrical connection therebetween.

That is, from a state in which the IC package 12 is held by an automatic machine and the upper operation member 14 is positioned as shown in FIG. 17A, the upper operation member 14 is pressed downward so as to move downward. In a state of the upper operation member 14 shown in FIG. 17A, the upper operation member 14 is located by the urging force of the spring 21 in the upper limit position. When the upper operation member 14 moves downward from the upper limit position, the release member 35 moves downward so as to be in contact with the bent portion 32c of the latch arm member 32. Thereafter, when the upper operation member 14 further moves downward together with the release member 35, because the urging force of the third spring which urges the release member 35 toward the clockwise direction in FIG. 17 is larger than the urging force of the second spring which urges the latch member 16 along the clockwise direction in FIG. 17, the latch arm member 32 and the latch member 16 pivot together toward the counter-clockwise direction in a body by the pressing force of the release member 35 so that the press member 15 is released from the latched state in which the press member 15 is engaged with and latched to the latch member 16 (as referred to FIG. 18C).

Figure 18A:
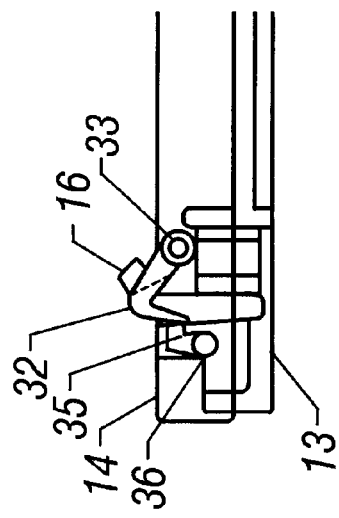
FIGS. 18A and 18B are views for explaining a motion of the upper operation member of the IC socket when the upper operation member is operated according to the embodiment.
Figure 18A:
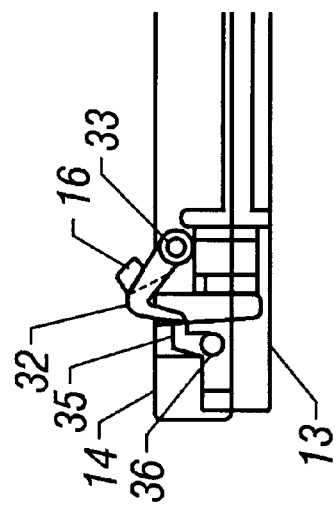
Figure 18A:
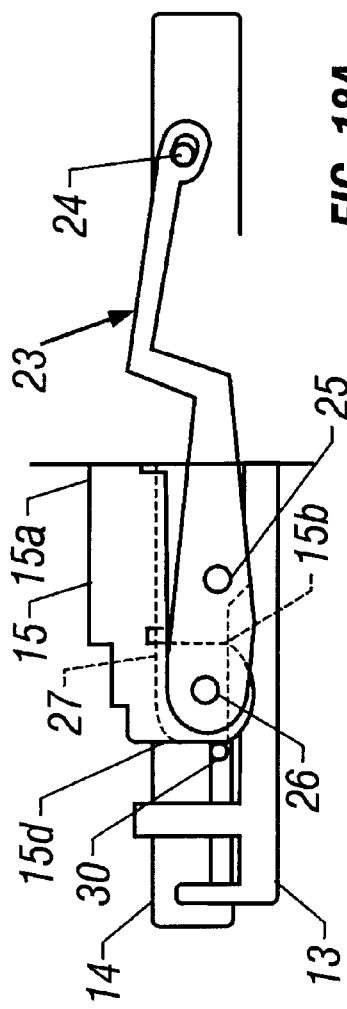
Figure 18B:
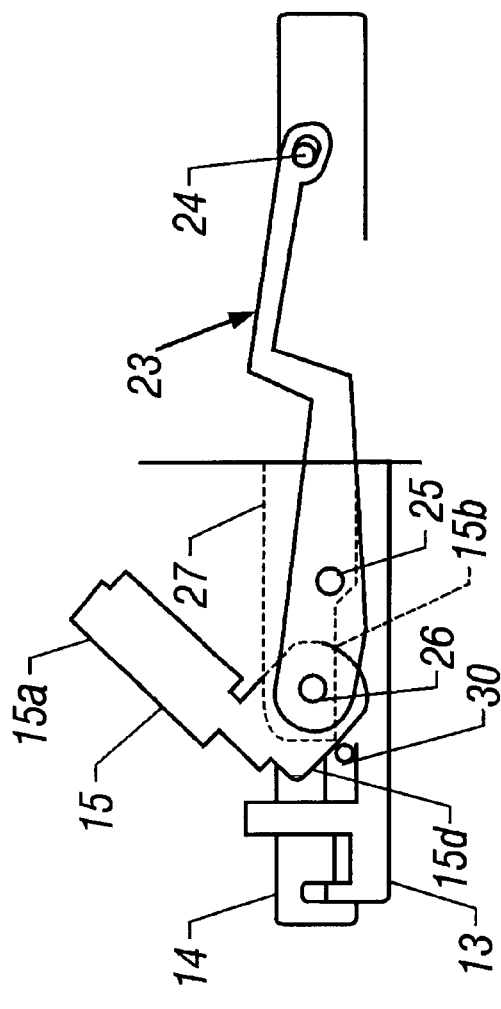
Figure 19A:
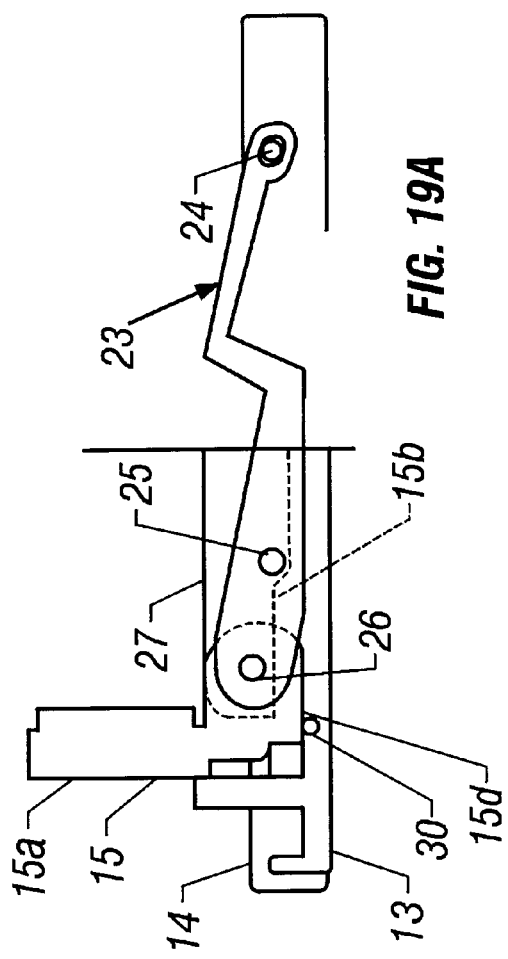
FIGS. 19A and 19B are views for explaining a motion of the upper operation member of the IC socket when the upper operation member is operated according to the embodiment.
Figure 19A:
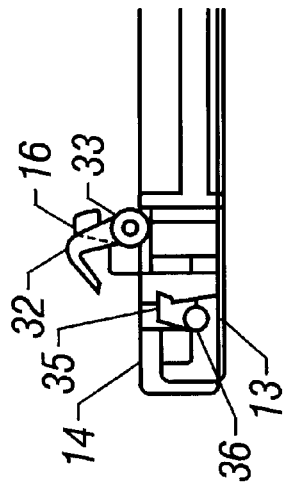
Figure 19B:
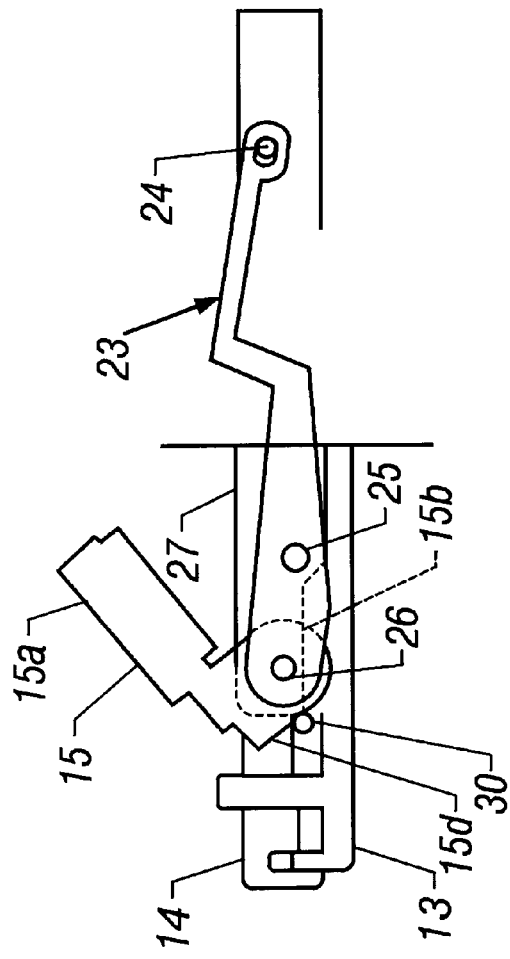
Figure 19B:
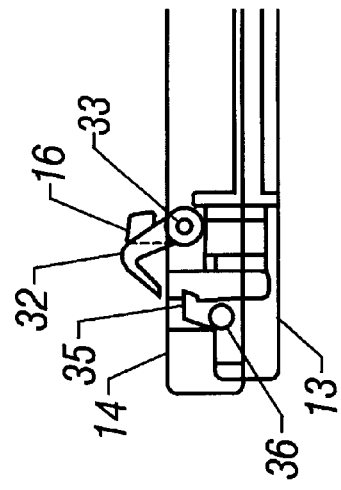

The downward movement of the upper operation member 14 makes the actuation pin 30 slide, while the actuation pin 30 is in contact with the slide side portion 15d of the press member 15, from the upper end portion of the slide side portion 15d toward the lower direction, so that, in cooperation with the release of the latched state of the press member 15, the press member 15 pivots from the upper side of the socket body 13 toward the first side portion or the second side portion of the socket body 13 as referred to FIG. 18D and FIG. 19E.

At that time, one end portion of the long hole 23a side of the link member 23 is pressed downward by the downward movement of the upper operation member 14, whereby the link member 23 pivots about the support pin 25 secured to the socket body 13. The pivotally movement of the link member 23 makes other end portion of the long hole 23b side of the link member 23 displace upward so that the support member 27 joined to the second pin 26 moves upward. When the support member 27 moves upward, since the link member 23 pivots about the support pin 25, both end portions of the link member 23 move so as to describe an arc of a circle, but the upper operation member 14 and the support member 27 are adapted to make a parallel displacement along the vertical direction toward the socket body 13. When the upper operation member 14 and the support member 27 are displaced in parallel, the support member 27 is prevented from moving along the horizontal direction by the support pin 25 penetrating the long hole 27a so that, actually, the support member 27 is supported by the two link members 23 crossed each other. Therefore, it is possible to displace the upper operation member 14 and the support member 27 to be parallel to the vertical direction with respect to a package mounted portion, that is, the one surface of the floating plate 19 of the socket body 13 while the upper operation member 14 and the support member 27 are so extremely kept as to be positioned along the horizontal direction.

While the press member 15 has opened, as shown in FIG. 19E, the flat plate 15a of the press member 15 opens until the maximum limit of the opening movement so that the flat plate 15a is arranged along the vertical direction, whereby the press member 15 goes out of an insertion area formed above the IC package 12.

As described above, while the upper operation member 14 moves downward, the press member 15 pivotally moves upward so as to reach to the maximum limit position, whereby the press member 15 is opened entirely.

While the press member 15 is opened entirely, the IC package 12 is released from the automatic machine and the IC package 13 is mounted on the floating plate 19. In a case where the IC package 13 is mounted on the floating plate 19, the IC package 12 is located in a predetermined position via the guide portions 19a, and the terminals 12b of the IC package 12 are in contact with the corresponding upper end portions of the contact pins 20.

Thereafter, when the pressing force of the upper operation member 14 is released by the automatic machine, the upper operation member 14 which is located as shown in FIG. 19E, is moved upward by the urging force of the spring 21, thereby moving the actuation pin 30 upward. The upward movement of the actuation pin 30 makes the press member 15 press so that the press member 15 pivots along the clockwise direction corresponding to the closing direction in FIG. 19, whereby the flat plate portion 15a of the press member 15 is arranged along the horizontal direction above the IC package 12 mounted on the floating plate 19 as referred to FIG. 20G.

When the flat plate portion 15a is arranged along the horizontal direction, an end edge portion of the flat plate portion 15a of the press member 15, which is opposite to a taper surface of the engage portion 16c of the latch member 16, having the open-close structure like the biparting door is slid in with a taper surface of the engaging portion 16c of the latch member 16 so as to get over the engaging portion 16c t hereof, thus the engage portion 16c is engaged with the one end portion of the flat plate portion 15a.

In cooperation with the engagement of the engaging portion 16c of the latch member 16 with the flat plate portion 15a of the press member 15, the upward movement of the upper operation member 14 makes the support member 27 move downward through operation of the link member 23, so that the flat plate portion 15a of the press member 15, which is arranged along the horizontal direction above the IC package 12 mounted on the floating plate 19, as shown in FIG. 20G, moves downward parallel to the vertical direction toward the IC package 12 mounted thereon, as shown in FIGS. 20H, 21I and 21J.

The downward movement of the press member 15 in parallel to the vertical direction makes the flat plate portion 15a of the press member 15 contact with the upper surface of the IC package 12, whereby the flat plate portion 15a of the press member 15 presses the IC package 12 downward by a predetermined pressing force. Since the flat plate portion 15a of the press member 15 moves downward in parallel to the vertical direction, the upper surface of the IC package 12 is pressed in a balanced state by the flat plate portion 15a. Therefore, the upper surface of the IC package 12 is pressed, each terminal 12b of the IC package 12 is in contact with corresponding each contact pins 20 by the predetermined pressing force so as to be welded thereto, thus the IC package 12 being electrically conducted to the socket body 13 and the printed circuit board.

In addition, when the upper operation member 14 moves upward, the release member 35 moves together with the upper operation member 14, so that the press member 35b of the release member 35, as shown in FIG. 20G, is in contact with a lower end portion of the bent portion 32c of the latch arm member 32. When the upper operation member 14 further moves upward, the latch arm member 32 pivots clockwise against the urging force of the second spring. When the latch arm member 32 pivots clockwise, the latch arm member 16 does not pivot and keeps standing vertically. Thereafter, as shown in FIG. 20I, the release member 35 gets over the lower end portion of the bent portion 32c of the latch arm member 32, so that the latch arm member 32 is returned to an original position by the urging force of the second spring.

Incidentally, the other press member 15 is the same as that of one of the press member 15 described above.

As described above, since the upper surface of the IC package 12 is pressed by the pair of press members 15 having the open-close structure like the biparting doors, as compared with the using of a conventional single press member having a large size, it is possible to reduce a space which allows the press member to pivot upward, so that it is not necessary to take up much space from an upper side of the IC socket 11. Therefore, it becomes possible to press the IC package 12 having a large size.

In a case of using the single press member having the large size for pressing the IC package, since a predetermined pressing force is applied to the single press member up to both end portions thereof, a spring force of a press spring must be increased more strongly, whereby an operation force for moving the single press member will be heavy.

However, according to the embodiment of the present invention, since the upper surface of the IC package 12 is pressed by the pair of press members 15 having the open-close structure like the biparting doors, the operation force of the upper operation member 14 is made light, and it is possible to surely press the whole upper surface of the IC package 12 with no-biased pressing force.

In addition, since the one end portion of the flat plate portion 15a is secured to the support member 27 by the latch member 16, even if the flat plate portion 15a has a large size, that is, the IC package 12 has a large size, the one end portion of the flat plate portion 15a do not float, thereby surely pressing, in a balanced state, the upper surface of the IC package 12.

Because the support member 27 to which the one end portion of the flat plate portion 15a is secured by the latch member 16 moves downward in parallel to the vertical direction, while the flat plate portion 15a keeps being arranged precisely along the horizontal direction, it is possible to press the upper surface of the IC package 12 by the flat plate portion 15a.

In the above embodiment, the present invention is applied to the IC socket as a socket for an electrical part, but the present invention is not limited to the application. That is, the present invention may be applied to a various of electrical parts.

In addition, in this embodiment, each side of a boundary portion of the one end portions of the press members 15 which are closed is fixedly latched by each latch member 16, so that the two press members 15 are fixed by the two latch members 16, but the present invention is not limited to the above structure. That is, the one end portion of one of the press members 15 may be latched on each side by each latch member 16 and the one end portion of other of the press members 15 may be latched on each side by each latch member 16 so that the one of the press members 15 is fixed by one pair of two latch members 16 and the other of the press members 15 is fixed by other of two latch members 16, respectively. In this case, even if the closing timing of one of the press members 15 is different from that of other one, the one pair of latch members 16 individually can wait for the one press member 15 approaching toward the one pair of latch members 16 with being most suitable therefor, and the other pair of latch members 16 individually can wait for the other press member 15 approaching toward the other pair of latch members 16 with being most suitable therefor.

Further, the latch means, the release means or other elements of the embodiment, is not limited to the above structures. For example, the latch means may have any structure capable of fixing the press member 15 with being closed, and the release means may have any construction capable of releasing the press members from the latched state by the latch means.

Further, it is to be noted that the present invention is not limited to the described embodiment and some modifications and many other changes or further modifications may be adopted without departing from the scopes of the appended claims.

What is claimed is:

1. A socket for an electrical part comprising:
   a socket body having a first surface on which the electrical part having a terminal is mounted;
   an electrical conductive member disposed to the socket body, said electrical conductive member coupled to the terminal of the electrical part so as to establish an electrical connection between the socket body and the terminal;
   a press member mounted to the socket body for pressing the electrical part, said press member being movable in an upward direction and downward direction with respect to the socket body, and pivoting between an open position and a close position,
   said open position being located away from an upper side of said first surface of the socket body, and
   said close position being located in the upper side of said first surface of socket body; and
   support means disposed to the socket body, said support means supporting the press member,
   wherein said support means causes the press member, which is positioned at the open position, to pivot to the close position, and causes the pivoted press member to move toward the electrical part on the first surface of the socket body after the pivot operation, thereby pressing the electrical part thereto.

2. A socket according to claim 1, wherein, when the press member is positioned at the close position, said press member is arranged parallel to said first surface of the socket body so as to move by the support means in parallel to a vertical direction orthogonal to said first surface of the socket body.

3. A socket according to claim 2, wherein said support means comprises an upper operation member disposed to the socket body so as to be movable along the vertical direction and a support device operatively joined to the upper operation member and the press member and adapted to operate together with the movement of the upper operation member, and when the upper operation member moves downward along the vertical direction, said support device operates according to the movement of the upper operation member so that the press member positioned to the close position moves upward along the vertical direction while pivoting to the open position, and wherein, when the upper operation member moves upward along the vertical direction, said support device operates according to the movement of the upper operation member so that the press member pivots from the open position to the close position and moves downward in parallel to the vertical direction, whereby the press member presses the electrical part mounted on the one surface of the socket body.

4. A socket according to claim 3, wherein said electrical part has one surface mounted on the one surface of the socket body and other surface facing the press member located to the close position and said press member presses the other surface of the electrical part.

5. A socket according to claim 3, wherein said press member comprises a pair of press members having a structure capable of being opened and closed like biparting doors.

6. A socket according to claim 1, wherein said support means includes an elastic member for urging the upper operation member, with a predetermined urging force, upward along the vertical direction, while each of said press members is arranged to each side of the socket body corresponding to the open position, said upper operation member being biased to a predetermined position against the urging force, and when the upper operation member moves upward along the vertical direction by the urging force from the predetermined position, each of said press members pivots from each side of the socket body toward the close position.

7. A socket according to claim 2, wherein, while the press member is positioned at the close position, said press member has a flat plate portion opposite to said first surface of the socket body and parallel to said first surface thereof, and said electrical part is pressed in a balanced state by the flat plate portion of the press member.

8. A socket according to claim 7, wherein, while said press member is positioned at the open position, said flat portion of the press member is arranged along the vertical direction in which the flat portion of the press member allows the electrical part mounted on said first surface to be removed therefrom.

9. A socket according to claim 3, wherein said support device has a support member disposed to the socket body to be movable along the vertical direction, said press member being mounted pivotally on the support member and link means joining the support member with the upper operation member and pivotally mounted on the socket body, wherein, when the upper operation member moves downward along the vertical direction, said support member moves upward therealong with a pivotal operation of the link means together with the press member and pivots from the close position to the open position, and when the upper operation member moves upward along the vertical direction, said press member pivots from the open position to the close position and moves downward along the vertical direction with a pivotal operation of the link means.

10. A socket according to claim 9, wherein said link means has two pairs of link members each of which has a first end portion, a second end portion, a middle portion, a pin hole formed through the middle portion, a support pin attached to the socket body and inserted in the pin hole for pivotally supporting the link member about the support pin, a first long hole formed through said first end portion, a first pin attached to the upper operation member and fitted idly in the first long hole, a second long hole formed through said second end portion and a second pin provided to the support member and fitted idly in the second long hole, said support member has a third long hole having a predetermined width in a longitudinal direction of which is arranged along the vertical direction, said support pin penetrating the third long hole of the support member and the predetermined width of the third long hole permitting the support member to be slidable along the vertical direction with respect to the support pin, and wherein, when the upper operation member moves downward along the vertical direction, each of the link members pivots about the support pin so that other end portion of each of the link members is displaced upward along the vertical direction, whereby the support member and the press member joined together by the second pin make a parallel displacement along the vertical direction toward the mounted surface of the socket body, while the support member is prevented from moving along the horizontal direction by the support pin.

11. A socket according to claim 9, wherein said support means has latch means attached to the support member for fixedly latching the press member to the support member, said latched press member being located to the close position.

12. A socket according to claim 11, wherein said support means has means operatively joined to the latch means and the upper operation member for releasing the press member from the latched state to the support member according to the downward movemont of the upper operation member and for returning the press member to the latched state according to the upward movement of the upper operation member.

13. A socket according to claim 2, wherein said press member is provided with a heat sink for radiating heat caused from the electrical part.

* * * * *